United States Patent
Kaehs (10) Patent No.: US 9,621,114 B2
(45) Date of Patent: Apr. 11, 2017

(54) EFFICIENCY-OPTIMISED HIGH-FREQUENCY POWER AMPLIFIER

(71) Applicant: Rohde & Schwarz GmbH & Co. KG, Munich (DE)

(72) Inventor: Bernhard Kaehs, Unterhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/746,396

(22) Filed: Jun. 22, 2015

(65) Prior Publication Data
US 2016/0020733 A1    Jan. 21, 2016

(30) Foreign Application Priority Data

Jul. 15, 2014    (DE) .................. 10 2014 213 684

(51) Int. Cl.
*H03F 3/68*    (2006.01)
*H03F 1/02*    (2006.01)
(Continued)

(52) U.S. Cl.
CPC .......... *H03F 1/0288* (2013.01); *H01P 5/187* (2013.01); *H03F 3/19* (2013.01); *H03F 3/211* (2013.01);
(Continued)

(58) Field of Classification Search
CPC .......... H03F 5/00; H03F 3/45475; H03F 3/44; H03F 3/28; H03F 3/602; H03F 7/02; H03F 3/45085; H03F 3/26; H03F 1/14; H03F 3/21; H03F 2200/372; H03F 3/60; H03G 1/0023; H03G 1/0088; H01L 2924/3011
(Continued)

(56) References Cited

U.S. PATENT DOCUMENTS

| | | | | |
|---|---|---|---|---|
| 6,362,685 B1 * | 3/2002 | Vagher | .................... | H03F 3/602 330/124 R |
| 8,130,039 B2 * | 3/2012 | Dishop | .................... | H03F 3/211 330/276 |
| 2014/0085019 A1 * | 3/2014 | Mei | .................... | H01P 5/184 333/117 |

FOREIGN PATENT DOCUMENTS

| | | |
|---|---|---|
| EP | 1609239 B1 | 7/2010 |
| EP | 2698918 A1 | 2/2014 |
| JP | 2009-153193 A | 7/2009 |

OTHER PUBLICATIONS

"2-way Doherty amplifier with BLF888A", NXP Semiconductors, Application Note, Rev. 01-14 Nov. 2013.*

(Continued)

*Primary Examiner* — Steven J Mottola
*Assistant Examiner* — Hafizur Rahman
(74) *Attorney, Agent, or Firm* — Ditthavong & Steiner, P.C.

(57) ABSTRACT

An amplifier according to the principle of load modulation comprises a first push-pull transistor, a second push-pull transistor and a balanced hybrid coupler. The first push-pull transistor is configured as a main amplifier and generates a balanced main-amplifier signal. The second push-pull transistor is configured as an auxiliary amplifier and generates a balanced auxiliary-amplifier signal. Outputs of the first push-pull transistor and of the second push-pull transistor are connected to the balanced hybrid coupler in such a manner that the balanced hybrid coupler combines the main-amplifier signal and the auxiliary amplifier signal according to the principle of load modulation to form a balanced output signal.

15 Claims, 5 Drawing Sheets

(51) Int. Cl.
*H03F 3/19* (2006.01)
*H03F 3/21* (2006.01)
*H03F 3/26* (2006.01)
*H03F 3/24* (2006.01)
*H03F 3/60* (2006.01)
*H01P 5/18* (2006.01)

(52) U.S. Cl.
CPC .............. *H03F 3/245* (2013.01); *H03F 3/26* (2013.01); *H03F 3/602* (2013.01); *H03F 2200/192* (2013.01); *H03F 2200/451* (2013.01); *H03F 2203/21106* (2013.01)

(58) Field of Classification Search
USPC ... 330/3, 69, 74, 116, 117, 124 R, 134, 252, 330/254, 262, 275, 284, 292, 295, 301, 330/307, 55
See application file for complete search history.

(56) References Cited

OTHER PUBLICATIONS

BLF888A, UHF power LDMOS transistor, Rev. 5-21 Jan. 2011 Product data sheet.*
"Xinger®-III Doherty Combiner Offers Advantages over a PCB Combiner", published in Microwave Journal, Apr. 10, 2011.*
Carneiro, M.L. et al.: Doherty Amplifier Optimization Using Robust Genetic Algorithm and Unscented Transform. In: IEEE 9th International New Circuits and Systems Conference (NEWCAS), IEEE Conference Publications, 2011, pp. 77-80.
Kaymaksut, E et al.: E-band Transformer-based Doherty Power Amplifier in 40 nm CMOS. In: IEEE Radio Frequency Integrated Circuits Symposium, Jun. 1-3, 2014, IEEE Conference Publications, pp. 167-170.
Kaymaksut, E. et al.: Transformer-Based Uneven Doherty Power Amplifier in 90 nm CMOS for WLAN Applications. In:IEEE Journal of Solid-State Circuits, Jul. 2012, vol. 47, No. 7, pp. 1659-1671.

* cited by examiner

EFFICIENCY-OPTIMISED HIGH-FREQUENCY POWER AMPLIFIER

CROSS-REFERENCE TO RELATED APPLICATION

This application claims priority of German patent application DE 10 2014 213 684.9 filed on Jul. 15, 2014.

FIELD OF THE INVENTION

The invention relates to a high-frequency power amplifier which operates internally with a balanced signal and operates in a similar manner to a Doherty amplifier on the principle of load modulation.

BACKGROUND OF THE INVENTION

Since high-frequency power amplifiers in transmission units, especially in base stations or radio and television transmitters, participate significantly in the energy consumption of the overall unit and accordingly directly influence operating costs, their level of efficiency is a substantial feature. To achieve large signal bandwidths or to allow a rapid frequency change, the high-frequency bandwidth of the amplifier is also an important criterion. In this context, a wide spacing of the first harmonic is also desirable at the same time, because, with just under one octave bandwidth, it is only possible to achieve required harmonic spacing with a filter connected downstream subject to considerable technical effort.

Many modern transmission standards, for example, MC-GSM, WCDMA, DVB-T/T2, DAB, ATSC, operate with modulations which provide a non-constant envelope. By contrast, with signals with a constant envelope, such as FM, power peaks can occur which are disposed significantly above the average power. In particular, modulations which exploit OFDM provide a high crest factor within the range of approximately 7-10 dB, which corresponds to the ratio of peak envelope power $P_{PEP}$ (PEP=peak envelope power) to average power $P_{AVG}$. Accordingly, the power amplifiers must be dimensioned for the relatively rarely occurring signal peaks, although they are operated on average with a significantly reduced modulation.

In the case of conventional power amplifiers in AB operating mode, the efficiency increases with increasing modulation and reaches the maximum value with full modulation in the compression range, that is, in the case of the rare signal peaks. Accordingly, a low efficiency of typically 25% is obtained for the average power $P_{AVG}$ in the case of OFDM signals, such as they occur, for example, with DVB-T.

Numerous circuits based on the Doherty principle have been developed in recent years. In this context, the narrow bandwidth of approximately 10-15% in each case, which necessitates an effort-intensive frequency re-tuning in order to cover a relatively larger frequency range, is disadvantageous, see EP 2 698 918 A1. The signal bandwidth is therefore restricted to the relative bandwidth of the amplifier, so that some applications are excluded. The narrow bandwidth is attributable to the frequency behavior of the impedance inverter itself, but also to the delay time and the frequency response of the matching network.

The impedance inverter of a Doherty circuit is typically arranged after the matching network. The bandwidth is disadvantageously influenced by the high impedance level of the impedance inverter and the delay time through the matching network to the transistor. For this reason, it has been attempted in some circuits to arrange the impedance inverter at a very low impedance level close to the transistor and to realize the transformation to the system impedance of typically 50 ohms only after the impedance inverter. Here also, the bandwidth can be increased as a result.

However, single-ended (common mode) transistor amplifiers which generate an unbalanced signal shape and which therefore by their nature provide a high second harmonic, which is also transmitted to the output in the case of broad bandwidths, are conventionally used in this context. A typical single-ended amplifier comprises an input matching network, the transistor and an output matching network, wherein the output matching network can also be arranged after an impedance inverter in order to increase the bandwidth.

Broadband power amplifiers for high powers are typically embodied using push-pull technology (push-pull circuit). This has the advantage of a balanced signal shape, thereby suppressing the even-numbered harmonics on principle. By contrast with a single-ended circuit, a significantly improved harmonic spacing is achieved, especially in the case of the first harmonic, which substantially determines the requirements of a harmonic filter.

Figure 1:
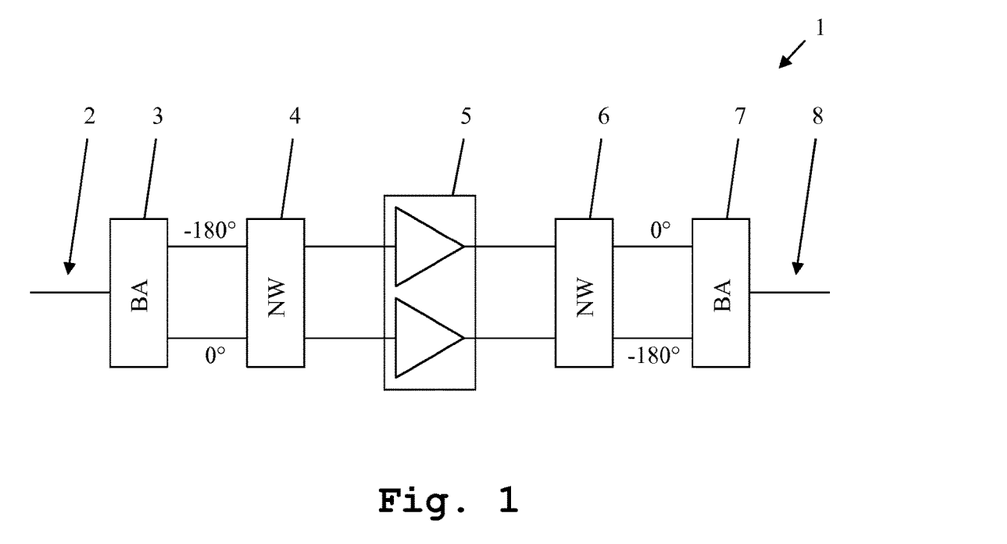
FIG. 1 is an exemplary push-pull (push-pull) amplifier.

FIG. 1 shows such a push-pull amplifier 1. An input signal 2 is supplied to a balun 3 at the input. The balun 3 transforms the signal into a balanced signal and delivers it to a matching network 4. From the matching network 4, the matched signal is supplied to the push-pull transistor 5. An amplified signal is supplied to an output matching network 6 which delivers it to an output balun 7. The output balun 7 transforms the signal back to an unbalanced line system and outputs it as an output signal 8.

Figure 2:
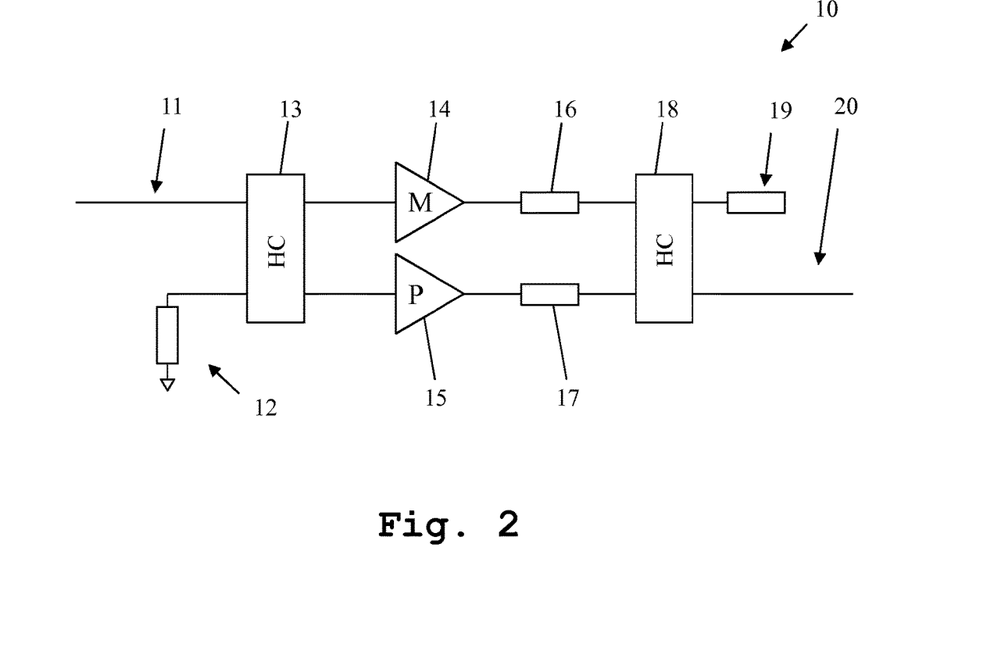
FIG. 2 is an exemplary amplifier according to the principle of load modulation similar to a Doherty amplifier.

Furthermore, the use of an amplifier according to the principle of load modulation, in which the function of the impedance inverter is realized by means of a hybrid coupler, is known from EP 1 609 239 B1. FIG. 2 shows such an amplifier. The amplifier 10 in FIG. 2 contains a first hybrid coupler 13 to which an input signal 11 is supplied. A further input terminal of the hybrid coupler 13 is terminated with a load balancing resistor 12. Outputs of the hybrid coupler 13 are connected to a main amplifier 14 and an auxiliary amplifier 15. Outputs of the amplifiers are connected to matching networks 16, 17, which are connected in turn to a further hybrid coupler 18. This hybrid coupler 18 accordingly fulfils the function of the impedance inverter. One port of the hybrid coupler 18 in this context is terminated with a "length transmission line" 19. An output signal 20 is output at a further output of the hybrid coupler 18.

The invention is therefore based upon one object of providing an amplifier which can cover a broad bandwidth with high efficiency and a wide harmonic spacing.

SUMMARY OF THE INVENTION

An amplifier according to one aspect of the invention provides a first push-pull transistor, a second push-pull transistor and a balanced hybrid coupler. The first push-pull transistor is configured as a main amplifier and generates a balanced main-amplifier signal. The second push-pull transistor is configured as an auxiliary amplifier and generates a balanced auxiliary-amplifier signal. Outputs of the first push-pull transistor and of the second push-pull transistor are connected in such a manner to the balanced hybrid coupler that the balanced hybrid coupler combines the main-amplifier signal and the auxiliary-amplifier signal according to the principle of load modulation to form a balanced output signal. A very broad bandwidth can be achieved by positioning of the balanced hybrid coupler at a low impedance level as close as possible to the transistor, since the balun and the load matching are positioned behind the impedance inverter.

By preference, the first push-pull transistor and the second push-pull transistor are connected directly to the balanced hybrid coupler in this context. That is, there is no balun arranged between the push-pull transistors and the balanced hybrid coupler. Accordingly, it is possible to achieve a very short line length between the push-pull transistors and the balanced hybrid coupler. As a result of the short line length and the low impedance level, a particularly broad bandwidth is achieved.

In an alternative embodiment, a matching network is arranged respectively between the first push-pull transistor and the balanced hybrid coupler and between the second push-pull transistor and the balanced hybrid coupler in order to transform to a real load impedance. This matching network can be embodied, for example, merely in the form of a capacitor to ground, a series inductor or a line portion. This matching network does not significantly increase the line length between the push-pull transistors and the balanced hybrid coupler. Accordingly, a matching can be implemented without significantly reducing the bandwidth.

By preference, the amplifier provides a first balun which is connected to the balanced hybrid coupler. In this context, the first balun is embodied in order to convert the balanced output signal into an unbalanced output signal. The amplifier accordingly produces an output signal which can be connected directly to an antenna.

By preference, isolation terminals of the balanced hybrid coupler are terminated in each case directly with a reflecting element. Alternatively, the isolation terminals of the balanced hybrid coupler are guided by means of a second balun to a common reflecting element and terminated by the latter. The at least one reflecting element is an ohmic resistor, an open circuit, a short circuit, a capacitor, a line element, an inductor or a combination of at least two of the previously named elements. Accordingly, a high level of flexibility of the circuit design is achieved.

By preference, the amplifier is embodied in this context for the amplification of a balanced input signal. In this case, the amplifier provides a further balanced hybrid coupler which is embodied to generate from the balanced input signal a balanced main-amplifier input signal and to supply the latter at least indirectly to the first push-pull transistor. Furthermore, the further balanced hybrid coupler is embodied to generate a balanced auxiliary-amplifier input signal and to supply the latter indirectly to the second push-pull transistor. The further balanced hybrid coupler is accordingly embodied to generate a phase offset of 90° between the balanced auxiliary-amplifier input signal and the balanced main-amplifier input signal. In this manner, a balanced input signal can be processed with less demanding circuitry.

Alternatively, the amplifier serves for the amplification of an unbalanced input signal. In this case, the amplifier provides an unbalanced hybrid coupler which is embodied to generate from the unbalanced input signal an unbalanced main-amplifier input signal and an unbalanced auxiliary-amplifier input signal phase displaced by 90° from the latter. In this context, the amplifier provides a third balun which is connected and embodied with the unbalanced hybrid coupler and at least indirectly with the first push-pull transistor in order to generate from the unbalanced main-amplifier input signal a balanced main-amplifier input signal and to supply the latter to the first push-pull transistor. In this case, the amplifier further comprises a fourth balun which is connected to and embodied with the unbalanced hybrid coupler and at least indirectly to the second push-pull transistor, in order to generate from the unbalanced auxiliary-amplifier input signal a balanced auxiliary-amplifier input signal and to supply the latter to the push-pull transistor. In this manner, even an unbalanced input signal can be processed with less demanding circuitry.

By preference, the amplifier provides a third matching network between the third balun and the first push-pull transistor. In this case, the amplifier provides a fourth matching network between the fourth balun and the second push-pull transistor. In this manner, a particularly accurate adjustment of the bandwidth can be made.

By preference, the balanced hybrid coupler is realized in this context as a printed line structure on a two-layer printed circuit board or multi-layer printed circuit board. This allows a particularly simple manufacture.

In one preferred embodiment, the balanced hybrid coupler is built up from two unbalanced hybrid couplers. This achieves a particularly simple circuit design.

By preference, the first and/or the second balun and/or the third balun and/or the fourth balun are realized in this context as printed lines, a Marchand balun, separate modules, a line balun with or without ferrite core, a voltage balun or a current balun. In this manner, a particularly flexible utilization of existing, standard baluns is possible.

By preference, the first push-pull transistor and the second push-pull transistor are each arranged in their own housing or built up from separate individual transistors. The flexibility of the circuit design can also be increased in this manner.

BRIEF DESCRIPTION OF THE DRAWINGS

In the following, the invention is described with reference to the drawings which show an advantageous exemplary embodiment of the invention by way of example only. The drawings show.

DETAILED DESCRIPTION OF THE DRAWINGS

Since the relevant prior art has already been described with reference to FIG. 1 and FIG. 2, different exemplary embodiments of the amplifier according to the invention will be described and their function explained with reference to FIGS. 3-7. In some cases, the presentation and description of identical elements in similar drawings has not been repeated.

Figure 3:
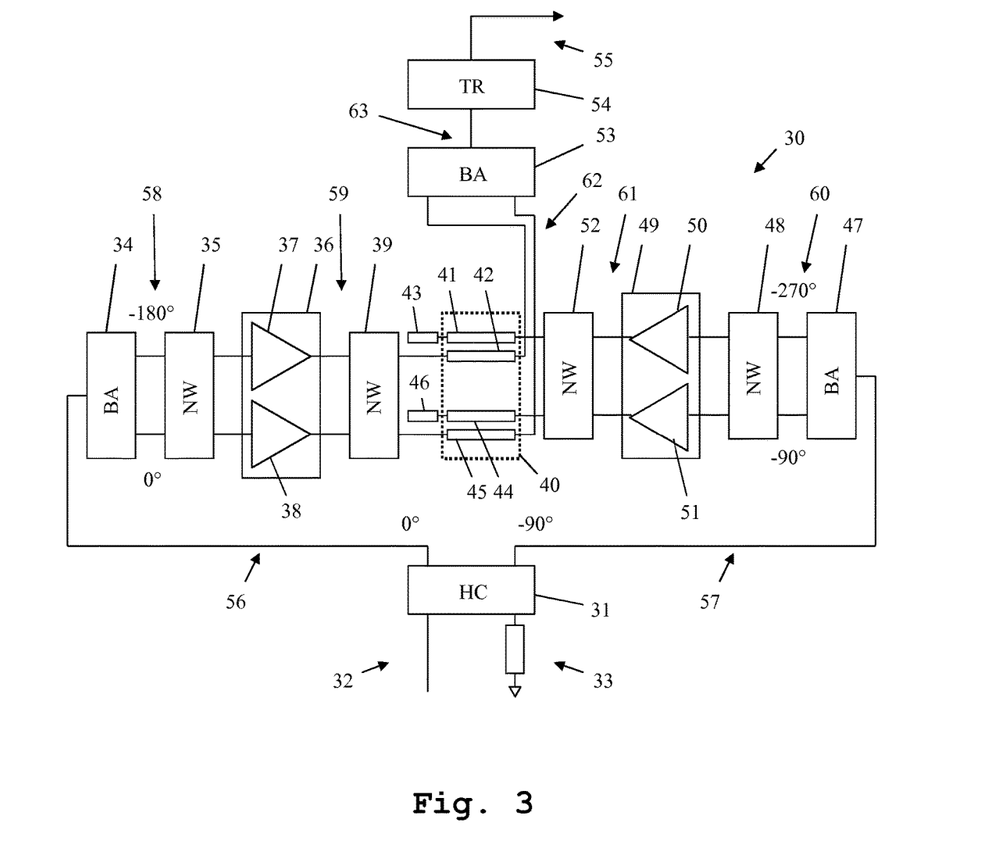
FIG. 3 is a first exemplary embodiment of the amplifier according to the invention.

FIG. 3 shows a first exemplary embodiment of the amplifier 30 according to the invention. The amplifier 30 according to the invention accordingly provides a hybrid coupler 31 which is supplied with an unbalanced input signal 32 at a first input terminal and terminated with a load-balancing resistor 33 at a second input terminal. The unbalanced input signal 32 is split by the hybrid coupler 31 into an unbalanced auxiliary-amplifier input signal 56 and an unbalanced main-amplifier input signal 57. In this context, a 90° phase offset exists between the signals 56, 57.

The auxiliary-amplifier input signal 56 is supplied to a balun 34 which converts the signal into a balanced auxiliary-amplifier input signal. The balun 34 is connected to an input matching network 35, to which the balanced auxiliary-amplifier input signal 58 is supplied. The input matching network 35 is connected in turn to a push-pull transistor, that is, to a transistor pair 36 comprising a first individual transistor 37 and a second individual transistor 38. The output signal of the input matching network 35 is supplied to the push-pull transistor 36 which amplifies it. The push-pull transistor 36 or respectively the push-pull amplifier accordingly generates a balanced auxiliary-amplifier signal 59. The push-pull amplifier 36 is connected in turn to an output matching network 39, to which the balanced auxiliary-amplifier signal 59 is supplied. The output matching network 39 is connected in turn to a balanced hybrid coupler 40. This balanced hybrid coupler 40 comprises two pairs of coupled lines 41, 42, 44, 45.

The hybrid coupler 31 additionally generates an unbalanced main-amplifier input signal 57 and supplies it to a balun 47 connected to the hybrid coupler 31. The balun 47 converts it into a balanced main-amplifier input signal 60. An input matching network 48, to which the balanced main-amplifier input signal 60 is supplied, is connected to the balun 47. The input matching network 48 is connected to a push-pull transistor 49, that is, a transistor pair, which comprises the individual transistors 50 and 51. An output signal of the input matching network 48 is supplied to the push-pull transistor 49 which amplifies it. An output matching network 52, to which a balanced main-amplifier signal 61 is supplied, is connected to outputs of the push-pull transistor 49.

In turn, outputs of the output matching network 52 are connected to the balanced hybrid coupler 40. The balanced hybrid coupler 40 is terminated at two ports with reflecting elements 43, 46. A balanced output signal 62 is present at the output terminals. Furthermore, a balun, which converts the balanced output signal 62 into an unbalanced output signal 63, is connected to the output terminals of the balanced hybrid coupler 40. A transformation network 54, which matches the unbalanced, low-ohmic output signal 63 to the load impedance or respectively the antenna impedance, is connected to an output of the balun 53.

In this context, the push-pull transistor 36 preferably operates as a C amplifier and accordingly as an auxiliary-amplifier according to the principle of load modulation, similar to the Doherty principle, and the push-pull transistor 49 operates in AB operating mode and accordingly as a main-amplifier of the load-modulation amplifier. The output matching networks 39, 52 can therefore contain an offset line in order to optimize the phase relationship.

In the case of a low modulation of the input signal 32, the push-pull transistor 36 is blocked because it operates in the C operating mode and appears in the signal-frequency range at the corresponding input of the balanced hybrid coupler 40 approximately like an open terminal. This open impedance can be optimized by means of the output matching network 39. In this case, the push-pull transistor 49 operates as a linear amplifier with double impedance $2 \times Z_{Lmain}$. The effective load impedance $Z_{Lmain}$ is generated via the unbalanced feeding of the coupler through reflection at the reflecting elements and feeding back into the output of the push-pull transistor 49.

As a result of this approximately doubled load impedance by comparison with the dimensioned value, the push-pull transistor 49 is already operated at approximately half power with optimal efficiency to saturation. With high modulation, both sides of the amplifier feed approximately the same power into the coupler. Via the phase relationship, the amplitudes of both signals are cancelled out at the port of the reflecting elements 43, 46, so that the latter are not active in the case of a high modulation. Both amplifiers 36 and 49 operate at the same low impedance $Z_{Lmain}$ and can also emit their maximum power with similarly optimal efficiency. The output power is emitted at the output via the balun 53 and the impedance transformation through the output-transformation network 54.

In order to improve the properties, the two reflecting elements 43, 46 presented here can also be dimensioned differently. In this context, the reflecting elements 43, 46 can be an ohmic resistor, an open circuit, a short circuit, a capacitor, a line element, an inductor or a combination of at least two of the previously named elements. The output can also be implemented in a balanced manner without the balun 53, if the overall system requires this. In this case, a balanced output signal is provided.

Dependent upon the complex impedance of the reflecting elements 43, 46, the two amplifier stages, which are formed with the push-pull transistors 36, 49, can also be exchanged in the case of an identical method of functioning. The inverse case can also be realized by exchanging the main-amplifier and the auxiliary-amplifier, dependent upon the complex impedance of the reflecting elements 43, 46. In the case of a low modulation, that is, a high-ohmic auxiliary amplifier, the main-amplifier initially operates with a low modulation at the impedance $Z_{Lmain}/2$ and with high modulation at the impedance $Z_{Lmain}$.

For the matching of the second efficiency optimum in the lower modulation range, the power of the auxiliary-amplifier and of the main-amplifier can be dimensioned differently. In this case, the hybrid couplers can also be subdivided unequally, for example, −4.77 dB and −1.76 dB instead of −3 dB and −3 dB.

The arrangement can also comprise several stages, which are connected together via further couplers in order to achieve a further optimization in efficiency by analogy with a multi-stage Doherty amplifier.

The first transformation at the output of the transistors can be dispensed with in the case of an appropriate transistor impedance. In this case, instead of complete matching networks 39, 52, only offset lines are present. The complete transformation can also be implemented at the output of the transistors. In this case, the transformation through the transformation network 54 is not required.

With the concept presented, the function of the impedance inverter is therefore realized through a balanced hybrid coupler at a low impedance level. With this concept, the balun 53 and the substantial part of the output transformation through the transformation network 54 are arranged after the balanced hybrid coupler 40. By arranging the hybrid coupler 40 close to the push-pull transistors 36, 49 at a low impedance level, the bandwidth can be significantly increased with a simultaneous advantage of the push-pull amplifier operating in a balanced manner with suppressed odd harmonics. This arrangement combines the advantage of a broad bandwidth, the advantage of the close harmonic spacing of a push-pull circuit and the advantage of high efficiency with the principle of load modulation, which is similar in function to a Doherty amplifier.

Figure 4:
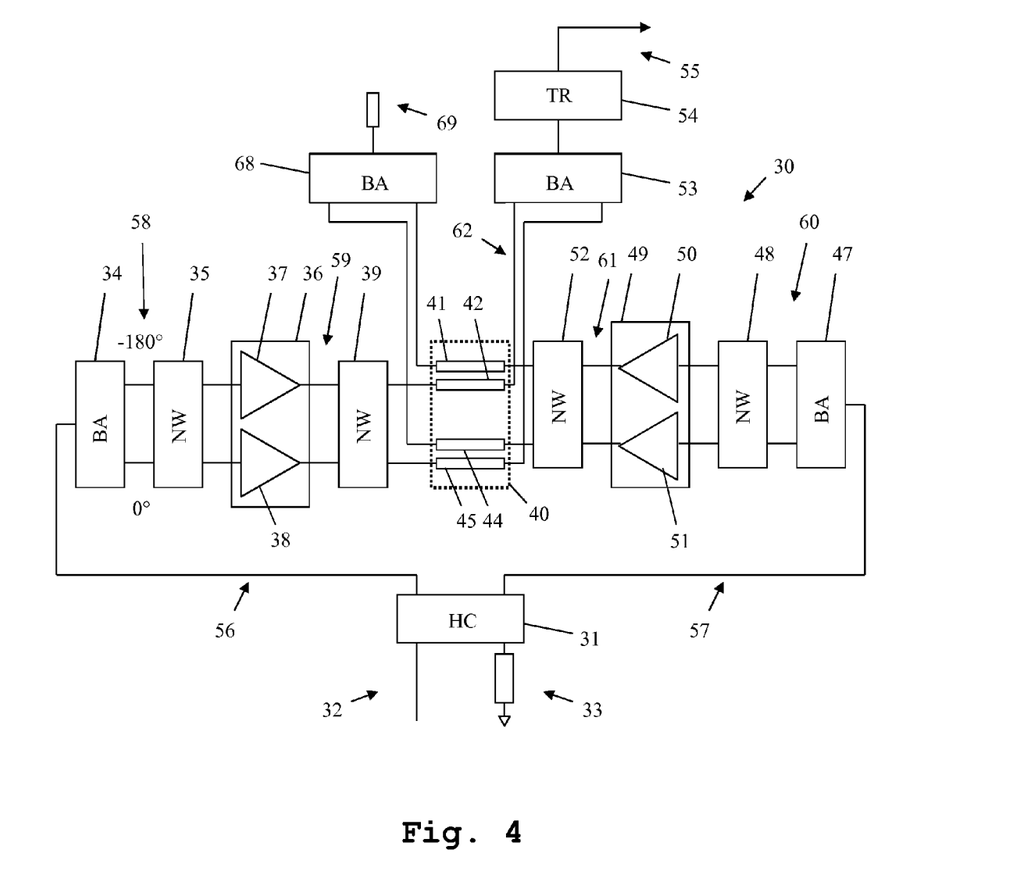
FIG. 4 is a second exemplary embodiment of the amplifier according to the invention.

FIG. 4 shows a second exemplary embodiment of the amplifier according to the invention. The illustration in FIG. 4 corresponds approximately to the illustration in FIG. 3. Modifications are provided here only at the termination of the balanced hybrid coupler 40.

By contrast with the termination of the isolation terminals of the balanced hybrid coupler 40 with individual reflecting elements 43 and 46 illustrated in FIG. 3, two ports of the hybrid coupler 40 here are connected to a further balun 68, which is terminated at an output terminal with a single reflecting element 69. In this context, the balanced hybrid coupler 40 can also be embodied as a configuration of two unbalanced hybrid couplers.

Accordingly, in different embodiments, all baluns can be embodied independently of one another, for example, in the form of printed lines, as a Marchand balun, as a separate module, as a line balun with or without ferrite core, as a voltage balun or as a current balun. In this context, the output transformation network 54 can also be arranged in front of the balun 53 or can form a functional unit with the balun 53.

The push-pull transistors 36, 49 can accordingly be embodied using an arbitrary technology. The two individual transistors 37, 38 or respectively 50, 51 can be arranged on the same chip or on separate chips and in the same housing or in separate housings. Even a deviation from transistors, for example, using valve technology, is conceivable. With both amplifying elements, the operating point can be fixed or matched dynamically during operation dependent upon the signal characteristic. In FIG. 3 and FIG. 4, only the components relevant for the high-frequency have been shown. For separation of the direct voltage, coupling capacitors, which can be arranged at the required position, are additionally required.

Figure 5:
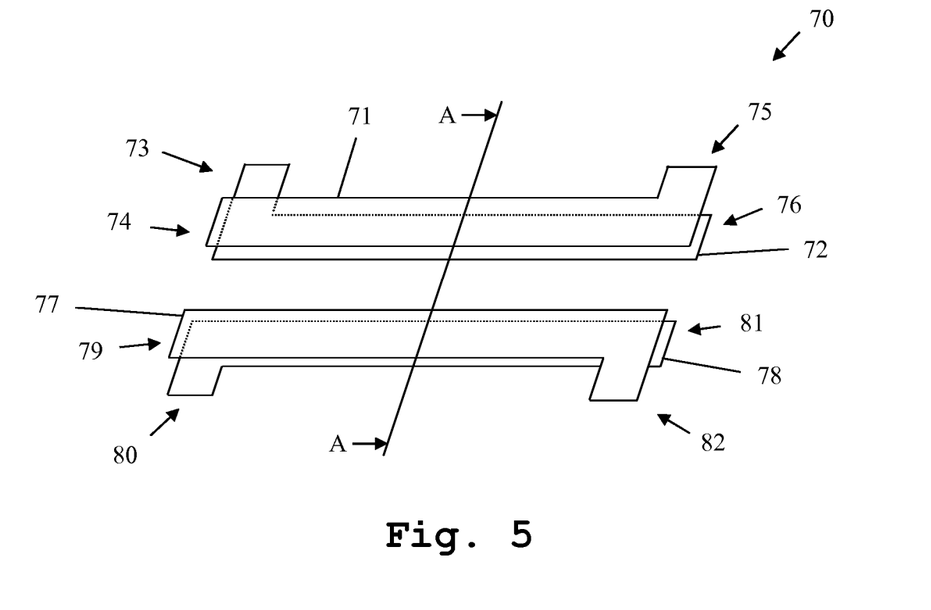
FIG. 5 is a first detail view of a third exemplary embodiment of the amplifier according to the invention.

FIG. 5 shows the construction of a hybrid coupler 70 of a further exemplary embodiment of the amplifier according to the invention. In the simplest case, the construction of the balanced hybrid coupler 70 can be implemented directly through printed lines on a two-sided printed circuit board. This possible formation is shown in FIG. 5. In this context, lines 71, 72 and 77, 78 each form a pair of coupled lines. Accordingly, the line 71 is coupled with the line 72, while the line 77 is coupled with the line 78. The supporting printed circuit board has not been shown here for reasons of visual clarity.

Accordingly, the line 71 comprises a terminal 74, which could be connected to the transistor 37 from FIG. 3, and a terminal 75, which could be connected to the balun 53 from FIG. 3. In this context, the line 72 comprises a terminal 73, which could be connected to the reflecting element 43 from FIG. 3 or to the balun 68 from FIG. 4, and a terminal 76, which could be connected to the transistor 50 from FIG. 3. Accordingly, the line 77 comprises a terminal 79, which could be connected to the transistor 38 from FIG. 3, and a terminal 82, which could be connected to the balun 53 from FIG. 3. Accordingly, the line 78 comprises a terminal 80, which could be connected to the reflecting element 46, from FIG. 3 or to the balun 68 from FIG. 4, and a terminal 81, which could be connected to the transistor 51 from FIG. 3.

Figure 6:
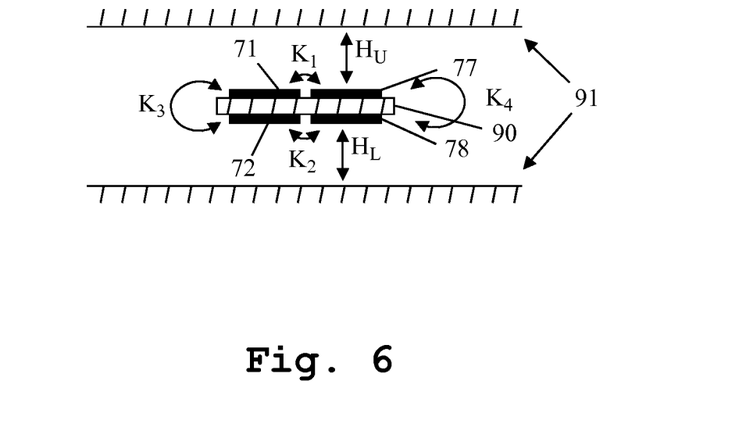
FIG. 6 is a second detail view of the third exemplary embodiment of the amplifier according to the invention.

FIG. 6 shows a cross-section along the section line A from FIG. 5. Here, the supporting printed circuit board 90 has been shown between the lines 71, 72, 77, 78. Furthermore, surrounding housing elements 91 have been shown. Relationships between individual elements have also been shown.

In the dimensioning of the common-mode and push-pull impedances $Z_{even}$ and $Z_{odd}$, the best possible decoupling must be taken into consideration, so that, for the coupling of the lines $K_3$ and $K_4$ coupled on the broad side, a coupling of the lines coupled on the long-side takes place in a similar manner via $K_1$ and $K_2$. Furthermore, the distance from the upper and lower ground $H_U$ and $H_L$ influences predominantly the common-mode impedance $Z_{even}$ and must be taken into consideration in the calculation.

Figure 7:
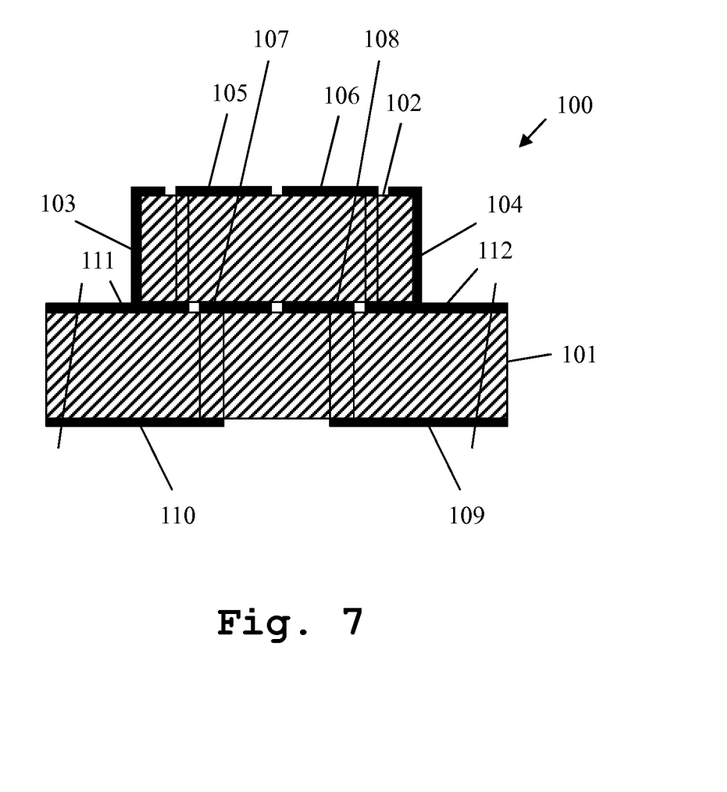
FIG. 7 is a detail view of a fourth exemplary embodiment of the amplifier according to the invention.

A further embodiment of the hybrid coupler 100 is shown in FIG. 7. An additional substrate layer is provided here, which is realized as a multi-layer printed circuit board or with a solder-mounted module.

A printed circuit board 101 is provided with ground layers 110 and 109 on its lower side. On its upper side, it is provided with further ground layers 111, 112. Furthermore, it is provided with lines 107, 108 on its upper side, which are arranged at a distance from the ground layers 111, 112. A second printed circuit board 102 is arranged on the first printed circuit board 101 and soldered to the latter. The ground areas 111, 112 of the first printed circuit board are connected by lateral ground areas 103, 104 of the second printed circuit board 102. These ground areas 103, 104 are generated, for example, by soldering. The ground areas 103, 104 of the second printed circuit board 102 extend, in this context, up to the upper side of the printed circuit board 102. Lines 105, 106 are additionally arranged on the upper side of the second printed circuit board 102. In this context, overlapping of the lines 105, 106 with the ground areas 111, 112 and overlapping of the lines 107, 108 with the ground areas 110, 109 occur.

The common-mode impedance $Z_{even}$ can be adjusted to the value required for a good coupling through the overlapping regions of the coupling lines 107, 108, 105, 106 with the ground areas 111, 112, 109, 110. In this context, the permittivity of the upper and lower layer 104, 101 can be designed differently in order to achieve a desired geometry.

The printed circuit boards 90, 101, 102 are therefore preferably embodied with a material of high permittivity. In particular, the printed circuit board 102 therefore provides a particularly high permittivity, preferably higher than the permittivity of the printed circuit board 101.

In this context, the invention is not restricted to the exemplary embodiment presented. All of the features described above or features shown in the drawings or features claimed in the claims can be advantageously combined with one another, arbitrarily within the scope of the invention.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An amplifier according to the principle of load modulation for the amplification of an input signal with a first push-pull amplifier, comprising a first transistor and a second transistor, a second push-pull amplifier and a balanced hybrid coupler,
wherein the first push-pull amplifier is configured as a main amplifier and generates a balanced main amplifier signal,
wherein the second push-pull amplifier is configured as an auxiliary amplifier and generates a balanced auxiliary amplifier signal,
wherein outputs of the first push-pull amplifier and of the second push-pull amplifier are connected to the balanced hybrid coupler in such a manner that the balanced hybrid coupler combines the balanced main amplifier signal and the balanced auxiliary amplifier signal to form a balanced output signal,
wherein the balanced hybrid coupler comprises two pairs of coupled lines,
wherein an output of the first transistor of the first push-pull amplifier and an output of the first transistor of the second push-pull amplifier are connected to a first pair of coupled lines of said two pairs of coupled lines, and
wherein output of the second transistor of the first push-pull amplifier and an output of the second transistor of the second push-pull amplifier are connected to a second pair of coupled lines of said two pairs of coupled lines.

2. The amplifier according to claim 1,
wherein the first push-pull amplifier is connected directly to the balanced hybrid coupler, and
wherein the second push-pull amplifier is connected directly to the balanced hybrid coupler.

3. The amplifier according to claim 1,
wherein the amplifier does not provide a balun between the first push-pull amplifier and the balanced hybrid coupler, and
wherein the amplifier does not provide a balun between the second push-pull amplifier and the balanced hybrid coupler.

4. The amplifier according to claim 1,
wherein the amplifier provides a first matching network between the first push-pull amplifier and the balanced hybrid coupler, and
wherein the amplifier provides a second matching network between the second push-pull amplifier and the balanced hybrid coupler.

5. The amplifier according to claim 1,
wherein the amplifier provides a first balun which is connected to the balanced hybrid coupler, and wherein the first balun is embodied to convert the balanced output signal into an unbalanced output signal.

6. The amplifier according to claim 1,
wherein isolation terminals of the balanced hybrid coupler are terminated in each case with a reflecting element.

7. The amplifier according to claim 1,
wherein two ports of the balanced hybrid coupler are guided by means of a second balun to a common reflecting element.

8. The amplifier according to claim 6,
wherein the at least one reflecting element is an ohmic resistor, an open circuit, a short-circuit, a capacitor, a line element, an inductance or a combination of at least two of the previously named elements.

9. The amplifier according to claim 1,
wherein the input signal is a balanced input signal,
wherein the amplifier provides a further balanced hybrid coupler, which is configured:
to generate from the balanced input signal a balanced main-amplifier input signal and to supply the latter at least indirectly to the first push-pull amplifier, and
to generate from the balanced input signal a balanced auxiliary amplifier input signal and to supply the latter at least indirectly to the second push-pull amplifier, and
wherein the further balanced hybrid coupler is embodied to generate the balanced auxiliary-amplifier input signal phase-shifted by 90° relative to the balanced main-amplifier input signal.

10. The amplifier according to claim 1,
wherein the input signal is an unbalanced input signal,
wherein the amplifier provides an unbalanced hybrid coupler, which is embodied to generate from the unbalanced input signal an unbalanced main-amplifier input signal and an unbalanced auxiliary-amplifier input signal phase-shifted by 90° relative to the latter,
wherein the amplifier provides a third balun, which is connected to the unbalanced hybrid coupler and at least indirectly to the first push-pull amplifier and is embodied to generate from the unbalanced main-amplifier input signal a balanced main-amplifier input signal and to supply the latter to the first push-pull amplifier, and
wherein the amplifier provides a fourth balun, which is connected to the unbalanced hybrid coupler and at least indirectly to the second push-pull amplifier and is embodied to generate from the unbalanced auxiliary-amplifier input signal a balanced auxiliary-amplifier input signal and to supply the latter to the second push-pull amplifier.

11. The amplifier according to claim 10,
wherein the amplifier provides a third matching network between the third balun and the first push-pull amplifier, and
wherein the amplifier provides a fourth matching network between the fourth balun and the second push-pull amplifier.

12. The amplifier according to claim 1,
wherein the balanced hybrid coupler is embodied as a printed line structure on a two-sided printed circuit board or multi-layer printed circuit board.

13. The amplifier according to claim 1,
wherein the balanced hybrid coupler comprises two unbalanced hybrid couplers.

14. The amplifier according to claim 1,
wherein the first balun and/or the second balun and/or the third balun and/or the fourth balun is or respectively are realized as a printed line, a Marchand balun, separate modules, a line balun with or without ferrite core, a voltage balun or a current balun.

15. The amplifier according to claim 1,
wherein the first push-pull amplifier and the second push-pull amplifier are arranged in each case in their own housing or are built up from separate individual transistors.

* * * * *